(12) United States Patent
Kamiya

(10) Patent No.: US 8,009,483 B2
(45) Date of Patent: Aug. 30, 2011

(54) NONVOLATILE MEMORY CELL AND DATA LATCH INCORPORATING NONVOLATILE MEMORY CELL

(75) Inventor: Masaaki Kamiya, Tokyo (JP)

(73) Assignee: Interchip Corporation (JP)

( * ) Notice: Subject to any disclaimer, the term of this patent is extended or adjusted under 35 U.S.C. 154(b) by 146 days.

(21) Appl. No.: 12/425,937

(22) Filed: Apr. 17, 2009

(65) Prior Publication Data

US 2009/0262584 A1 Oct. 22, 2009

(30) Foreign Application Priority Data

Apr. 18, 2008 (JP) ................................ 2008-109620

(51) Int. Cl.
*G11C 16/04* (2006.01)
(52) U.S. Cl. .......... 365/185.29; 365/185.18; 365/189.05
(58) Field of Classification Search ............. 365/185.29, 365/185.18, 189.05
See application file for complete search history.

(56) References Cited

U.S. PATENT DOCUMENTS

| | | | |
|---|---|---|---|
| 5,465,231 A | 11/1995 | Ohsaki | |
| 5,666,308 A * | 9/1997 | Ota | 365/185.05 |
| 7,558,111 B2 * | 7/2009 | Eftimie et al. | 365/185.08 |
| 7,630,247 B2 * | 12/2009 | Noda | 365/185.18 |
| 7,751,256 B2 * | 7/2010 | Chan et al. | 365/189.05 |

* cited by examiner

*Primary Examiner* — Pho M Luu
(74) *Attorney, Agent, or Firm* — The Webb Law Firm

(57) ABSTRACT

A nonvolatile memory cell includes: a first NMOS transistor having a floating gate; a second NMOS transistor and a third NMOS transistor connected to a drain side and a source side of the first NMOS transistor; and a first PMOS transistor and a second PMOS transistor each having the floating gate as a gate, and wherein a read signal is inputted to gates of the second and third NMOS transistors, a control gate signal is inputted to a source and an n-well of the first PMOS transistor, an erase signal is inputted to a source and an n-well of the second PMOS transistor, and a write data signal is inputted to a source of the first NMOS transistor.

10 Claims, 10 Drawing Sheets

WRITE

READ

ERASE

WAIT

NONVOLATILE MEMORY CELL AND DATA LATCH INCORPORATING NONVOLATILE MEMORY CELL

CROSS-REFERENCE TO RELATED APPLICATION

This application claims priority to Japanese Patent Application No. 2008-109620 filed Apr. 18, 2008, which is expressly incorporated by reference herein in its entirety.

TECHNICAL FIELD

This invention relates to a nonvolatile memory cell, and a data latch incorporating the nonvolatile memory cell, which are useful, particularly, as memory for timing circuit functions and circuit characteristics, the memory which can be prepared by a CMOS integrated circuit.

BACKGROUND ART

A nonvolatile memory device of a structure as shown in FIG. 10 has been proposed for application to a tuning switch of an integrated circuit according to a conventional technology (see Patent Literature 1). This nonvolatile memory device is a single-layer polysilicon structure, and can be prepared by a standard CMOS process. However, such a device has been proposed as a cell to be incorporated into a nonvolatile memory array. The memory array is effective for an application requiring memory exceeding 1 Kbits, but peripheral circuits surrounding the array are large-sized. Thus, the memory array is inconvenient to use for an application that does not require such large number of memories.

SUMMARY OF INVENTION

Technical Problem

In recent years, a demand has been growing for arbitrarily and easily setting the characteristics of a CMOS integrated circuit, for example. Concretely, there has been strong demand for an integrated circuit with a high degree of flexibility in which an internal reference voltage, for example, can be set to a target voltage by nonvolatile memory built in the integrated circuit and tuning data programmed into the memory.

A number of the nonvolatile memories necessary for tuning the integrated circuit may be at most several tens of bits in many applications, with conventional technologies, on the other hand, some difficulties are accompanied in order to build in such nonvolatile memories into the integrated circuit. One of them is that it needs the additional steps to the standard CMOS manufacturing process and another one is that it brings an extensive increase in the circuit size.

The present invention has been accomplished in the light of the above-mentioned conventional technologies. It is an object of this invention to provide a nonvolatile memory cell which can be easily produced by a standard CMOS manufacturing process and which can be conveniently used for tuning an integrated circuit.

Solution to Problem

A first aspect of the present invention is a nonvolatile memory cell, comprising: a first NMOS transistor having a floating gate; a second NMOS transistor and a third NMOS transistor connected to a drain side and a source side of the first NMOS transistor respectively; and a first PMOS transistor having the floating gate as a gate, and wherein a read signal is inputted to gates of the second and third NMOS transistors, a control gate signal is inputted to a source and an n-well of the first PMOS transistor, and a write data signal is inputted to either a drain or a source of the first NMOS transistor.

A second aspect of the present invention is the nonvolatile memory cell according to the first aspect, wherein the write data signal is inputted via an opening and closing gate.

A third aspect of the present invention is the nonvolatile memory cell according to the first or second aspect, further comprising a second PMOS transistor having the floating gate as a gate, and wherein an erase signal is inputted to a source and an n-well of the second PMOS transistor.

A fourth aspect of the present invention is the nonvolatile memory cell according to the third aspect, wherein electrons in the floating gate are erased by a tunnel current flowing through a gate insulating film of the second PMOS transistor while applying positive voltage pulses as the erase signal, with the control gate signal being set at a referenced voltage.

A fifth aspect of the present invention is the nonvolatile memory cell according to any one of the first to fourth aspects, wherein writing of electrons into the floating gate is performed by a tunnel current flowing through a gate insulating film of the first NMOS transistor while turning off the second and third NMOS transistors by use of the read signal, applying positive voltage pulses as the control gate signal and an erase signal, and applying the write data signal which controls the tunnel current.

A sixth aspect of the present invention is the nonvolatile memory cell according to any one of the first to fifth aspects, wherein reading from the nonvolatile memory cell is performed by inputting a positive voltage as the read signal, and opening the gates of the second and third NMOS transistors.

A seventh aspect of the present invention is the nonvolatile memory cell according to any one of the second to sixth aspects, wherein the opening and closing gate is composed of an NMOS transistor or a PMOS transistor.

An eighth aspect of the present invention is the nonvolatile memory cell according to any one of the second to seventh aspects, wherein the opening and closing gate is brought into conduction when electrons are written into the floating gate.

A ninth aspect of the present invention is the nonvolatile memory cell according to any one of the second to seventh aspects, wherein the opening and closing gate is shut off only during reading.

A tenth aspect of the present invention is a data latch incorporating a nonvolatile memory cell, comprising the nonvolatile memory cell according to any one of the first to ninth aspects, and a data latch circuit, and wherein a drain of the second NMOS transistor is connected to a load element to become a set signal for setting a state of the data latch circuit, and a Q output of the data latch circuit or an inverted output of the Q output becomes the write data signal.

Advantageous Effects of Invention

According to the present invention, the nonvolatile memory cell can be composed of the PMOS transistors and the NMOS transistors which can be prepared by the standard CMOS process.

Furthermore, the data latch incorporating a nonvolatile memory cell according to the present invention can suppress an increase in the chip area due to the installation of the nonvolatile memory, and can stably retain the data written into the memory.

DESCRIPTION OF EMBODIMENTS

The embodiments of the present invention will be described in detail with reference to the accompanying drawings. The same portions in the respective embodiments are assigned the same numerals and symbols, and duplicate explanations are omitted.

First Embodiment

Figure 1:
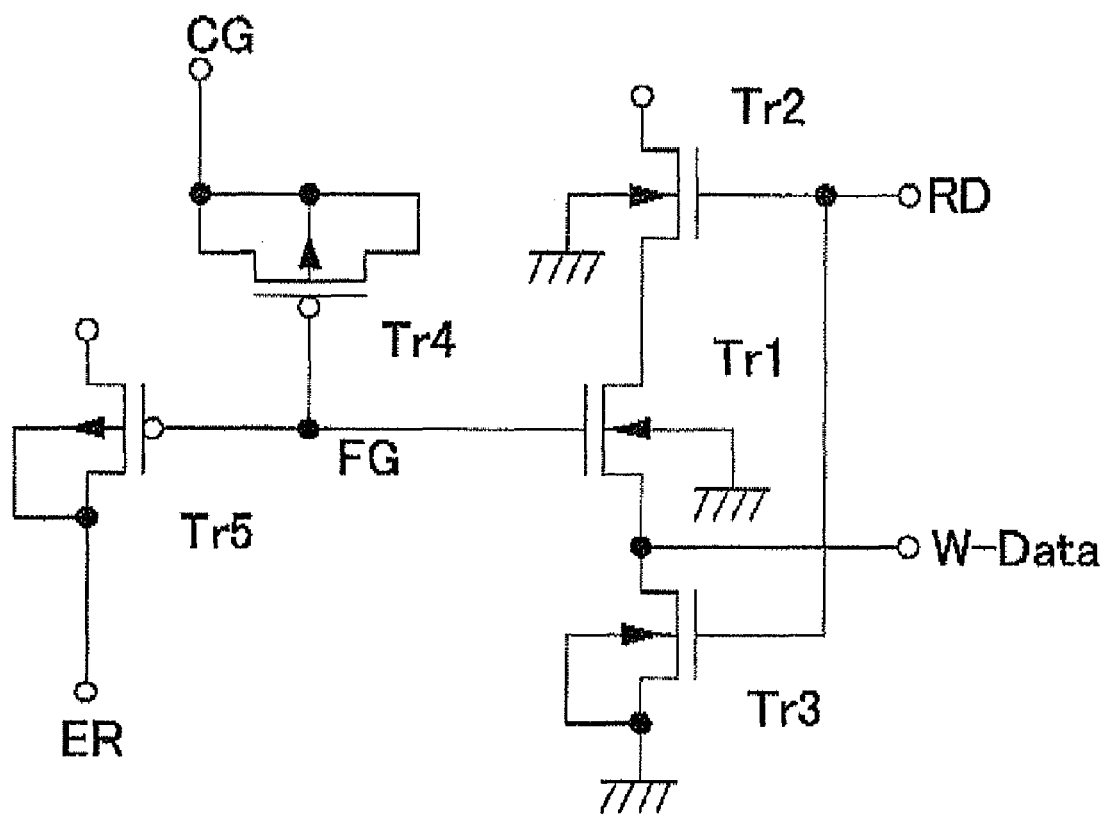
FIG. 1 is a circuit diagram showing a nonvolatile memory cell according to a first embodiment of the present invention.

FIG. 1 is a circuit diagram showing a nonvolatile memory cell according to a first embodiment of the present invention. As shown in FIG. 1, the nonvolatile memory cell according to the present embodiment has three NMOS transistors Tr1, Tr2 and Tr3, and two PMOS transistors Tr4 and Tr5. Of these transistors, the NMOS transistor Tr1 and the PMOS transistors Tr4 and Tr5, which have a common floating gate FG connected with each other, constitute nonvolatile memory, while the NMOS transistors Tr2 and Tr3 are connected to the drain side and the source side of the NMOS transistor Tr1 to perform some functions for the nonvolatile memory.

A write data signal W-Data is inputted to the source side of the NMOS transistor Tr1, a read signal RD is inputted to the gates of the NMOS transistors Tr2 and Tr3, a control gate signal CG is inputted to the source and the n-well of the PMOS transistor Tr4, and an erase signal ER is inputted to the source and the n-well of the PMOS transistor Tr5.

Figure 2A:
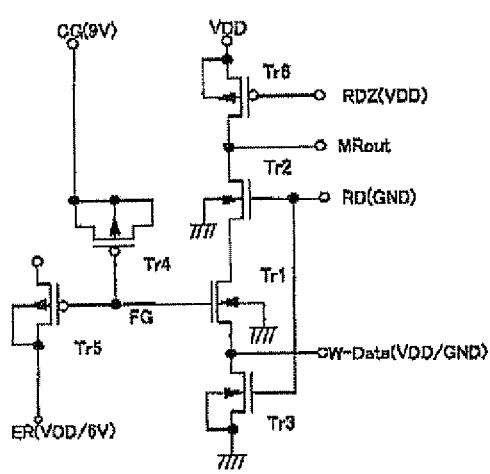
FIGS. 2A to 2D are circuit diagrams showing the 4 operating modes of the nonvolatile memory cell shown in FIG. 1, FIG. 2A showing a write mode, FIG. 2B a read mode, FIG. 2C an erase mode, and FIG. 2D a wait mode.
Figure 2B:
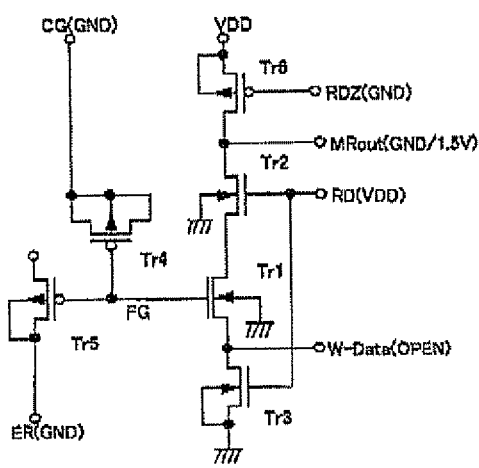
Figure 2C:
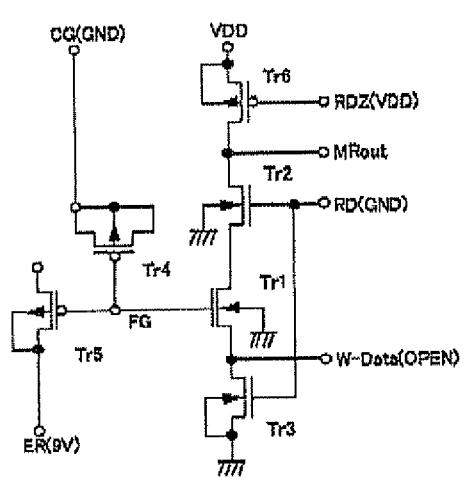
Figure 2D:
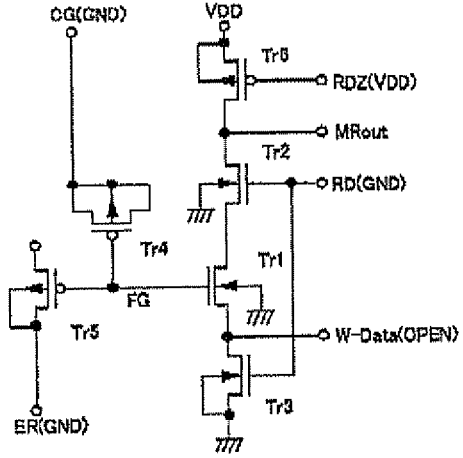

FIGS. 2A to 2D are circuit diagrams showing the 4 operating modes of the nonvolatile memory cell shown in FIG. 1, FIG. 2A showing a write mode, FIG. 2B a read mode, FIG. 2C an erase mode, and FIG. 2D a wait mode. In the circuit shown in FIGS. 2A to 2D, a PMOS transistor Tr6 is connected to the drain side of the NMOS transistor Tr2, but it need not be PMOS as long as it works as a load device. A memory output MRout, which is determined by the stored data in the nonvolatile memory, is outputted from the drain of the NMOS transistor Tr2. In the following descriptions, it is assumed that the gate of the MOS transistor is formed on a 7 to 9 nm thick gate oxide film through which a tunnel current flows upon application of a voltage of around 8V. On this assumption, the 4 operating modes are explained using concrete values.

In the write mode shown in FIG. 2A, the control gate signal CG has a positive predetermined voltage (9V in the present embodiment; the same applies hereinafter), and the erase signal ER has a positive predetermined voltage (a power supply voltage VDD (6V) in the present embodiment; the same applies hereinafter). The read signal RD has a ground potential GND, and thus the NMOS transistors Tr2 and Tr3 are in the off state.

When the write data signal W-Data is inputted in the write mode, electrons are injected into the floating gate FG by a tunnel current flowing through the gate insulating film of the NMOS transistor Tr1. Amount of the injected electrons is highly dependent on the logical level of the write data signal W-Data (i.e., H-state (VDD) or L-state (GND)). That is, when the write data signal W-Data is in the L-state, a lot of electrons are injected; whereas when the write data signal W-Data is in the H-state, very few electrons are injected. Thus, an electric charge in the floating gate FG is corresponding to the logical level of W-Data.

In the present embodiment, the voltage of the erase signal ER is set to be lower than the voltage of the control gate signal CG(9V), but this setting is not necessary. It is essential that the voltage of the erase signal ER is higher enough to prevent electron injection into the floating gate FG via the PMOS transistor Tr5. Then the electrons injected into the floating gate FG solely depend on the voltage of the write data signal W-Data. It goes without saying, therefore, that the voltage of the erase signal ER can be equal to the voltage of the control gate signal CG. By setting the voltage of the erase signal ER at the power supply voltage VDD, however, the erase signal ER can be easily supplied by using the power supply voltage VDD.

In the read mode shown in FIG. 2B, the read signal RD is at the power supply voltage VDD. It brings the NMOS transistors Tr2 and Tr3 into the on state. As a result, the conduction state of the NMOS transistor Tr1, which varies with the charge of the floating gate FG, can be detected from the memory output MRout. In the read mode, the control gate signal CG is grounded. If electrons are injected into the floating gate FG and the floating gate FG is negatively charged, the NMOS transistor Tr1 is in the off state, so that the memory output MRout is in the H-state. If electrons are removed from the floating gate FG and the floating gate FG is positively charged, the NMOS transistor Tr1 is in the on state, so that the memory output MRout is in the L-state. Thus, binary logical data corresponding to the charge in the floating gate FG can be read out.

When the NMOS transistor Tr1 is in the off state, nearly the power supply voltage VDD is applied to the drain of the Tr1 during the read mode, thus arousing the possibility that electrons are extracted from the floating gate FG which is negatively charged. To avoid this possibility, it is recommended to lower the power supply voltage to 2V or less, in the read mode.

In the read mode, the write data signal W-Data need to be disconnected from the source of NMOS transistor Tr1. In the other words, the write data signal W-data is in a shut-off state (OPEN). This is intended to avoid an influence of the write data signal W-data on the current flowing through the NMOS transistor Tr1. The erase signal ER is kept at the ground potential GND during this mode.

In the erase mode shown in FIG. 2C, the erase signal ER is set at a predetermined positive voltage (9V in the present embodiment; the same applies hereinafter). On the other hand, the control gate signal CG is kept at the ground potential GND. If the gate capacitance of the NMOS transistor Tr4 is large enough compared with that of the NMOS transistor Tr5, the voltage of the floating gate FG is governed by the voltage of the control gate signal CG. Therefore the voltage of the floating gate FG remains in the vicinity of the ground potential GND. As a result, a tunnel current flows via the gate insulating film of the PMOS transistor Tr5, and electrons in the floating gate FG are erased. That is, the floating gate FG comes to a positive voltage in spite of the presence or absence of the electrons in the floating gate before erasure.

In the erase mode, the read signal RD is kept at the ground potential GND. In the present embodiment, moreover, the supply of the write data signal W-Data is kept stopped. If the gate capacitance of Tr1 is small enough compared to that of Tr4, it is not necessary to stop the supply of the write data signal W-Data.

In the wait mode shown in FIG. 2D, the read signal RD, the control gate signal CG, and the erase signal ER are all set at the ground potential GND and, simultaneously, the supply of the write data signal W-Data is stopped. In this mode, all inputs to the transistors Tr1, Tr4 and Tr5 having the floating gate FG as the gate are set at the ground potential GND, and the voltage stress to the gate oxide films of these transistors are minimized. Thus, the charge of the floating gate FG can be preserved for long.

Figure 3:
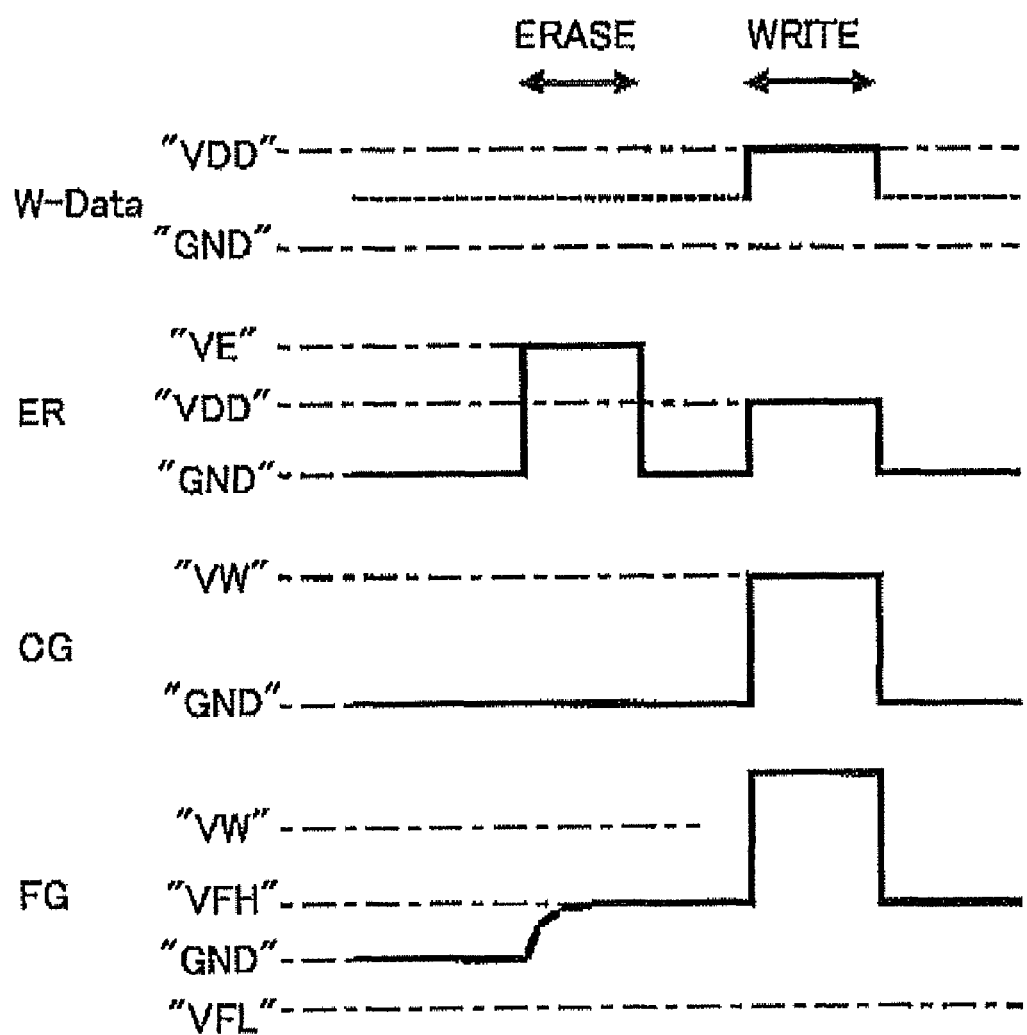
FIG. 3 is a waveform chart showing the waveforms of signals supplied to respective sections for illustrating the actions of the nonvolatile memory cell shown in FIG. 2, indicating the case that the write data signal W-Data is H-state.
Figure 4:
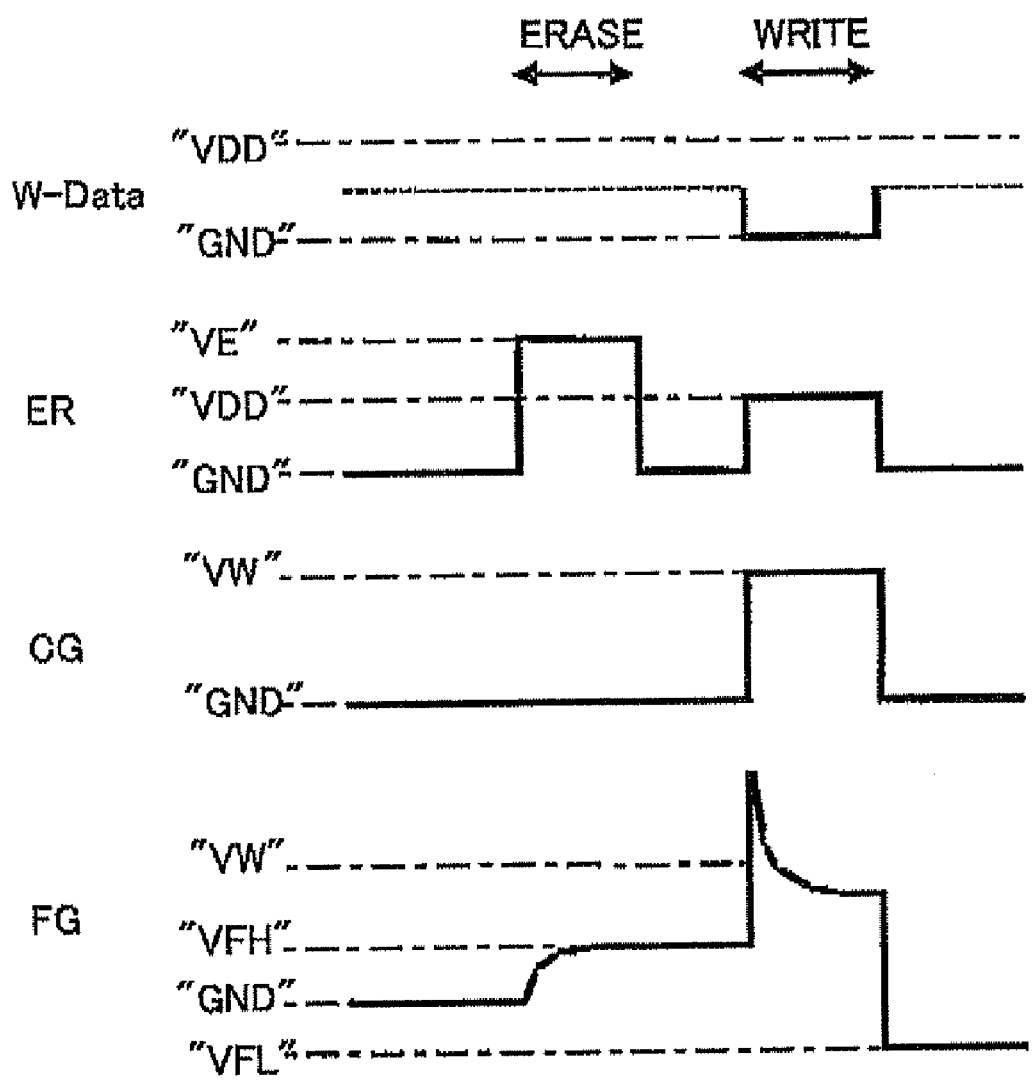
FIG. 4 is a waveform chart showing the waveforms of the signals supplied to the respective sections for illustrating the actions of the nonvolatile memory cell shown in FIG. 2, indicating the case that the write data signal W-Data is L-state.

FIGS. 3 and 4 are waveform charts showing the waveforms of the signals supplied for illustrating the erasing and writing actions of the above-mentioned nonvolatile memory cell. FIG. 3 indicates the actions for the H-state of the write data signal W-Data, and FIG. 4 indicates the actions for the L-state of the write data signal W-Data. In the following descriptions, the power supply voltage VDD is set at 6V during the erasing or writing action.

As shown in FIG. 3, when, in the erase mode, the erase signal ER rises from the ground potential GND to the erase voltage VE, electrons of the floating gate FG are driven off by a tunnel current flowing via the gate insulating film of the PMOS transistor Tr5. As a result, the electrons of the floating gate FG are erased, whereby the floating gate FG reaches the voltage of VFH higher than the ground potential GND. The voltage of VFH is necessary to be a voltage that makes the NMOS transistor Tr1 conductive, concretely, a value of 1V to 2V.

Then follows the write mode, in which the control gate signal CG has the write voltage VW (9V) and the erase signal ER comes to the power supply voltage VDD (=6V). Under the signal conditions, the voltage of the floating gate FG reaches a voltage of 10V to 11V because the control gate signal CG is superposed on the floating voltage VFH. When the write data signal W-Data is set in the H-state (6V), the voltage applied to the gate oxide film of the NMOS transistor Tr1 is 4V to 5V. As a result, a tunnel current flowing through this gate oxide film is virtually zero. After the erase signal ER and the control gate signal CG go back to the ground potential GND, the voltage of the floating gate FG resumes the floating voltage VFH, the same value as before writing. The write data signal W-Data indicated by a short dashed line in FIG. 3 represents a shut-off state (the same applies hereinafter).

On the other hand, the actions in the L-state of the write data signal W-Data are shown in FIG. 4. As shown in FIG. 4, the actions in the erase mode are the same as those when the write data signal W-Data is in the H-state, but in the write mode, actions are different from those in FIG. 3. When the control gate signal CG and the erase signal go up, the voltage of the floating gate FG once rises to 10V to 11V. Since the write data signal W-Data is at the ground potential, a voltage of 10V to 11V is applied to the gate insulating film of the NMOS transistor Tr1, so that a tunnel current flows. As a result, the voltage of the floating gate FG is lowered to 7V to 8V. Thus, when the erase signal ER and the control gate signal CG return to the ground potential GND, the voltage of the floating gate FG comes to a voltage VFL lower than the ground potential GND.

Second Embodiment

Figure 5:
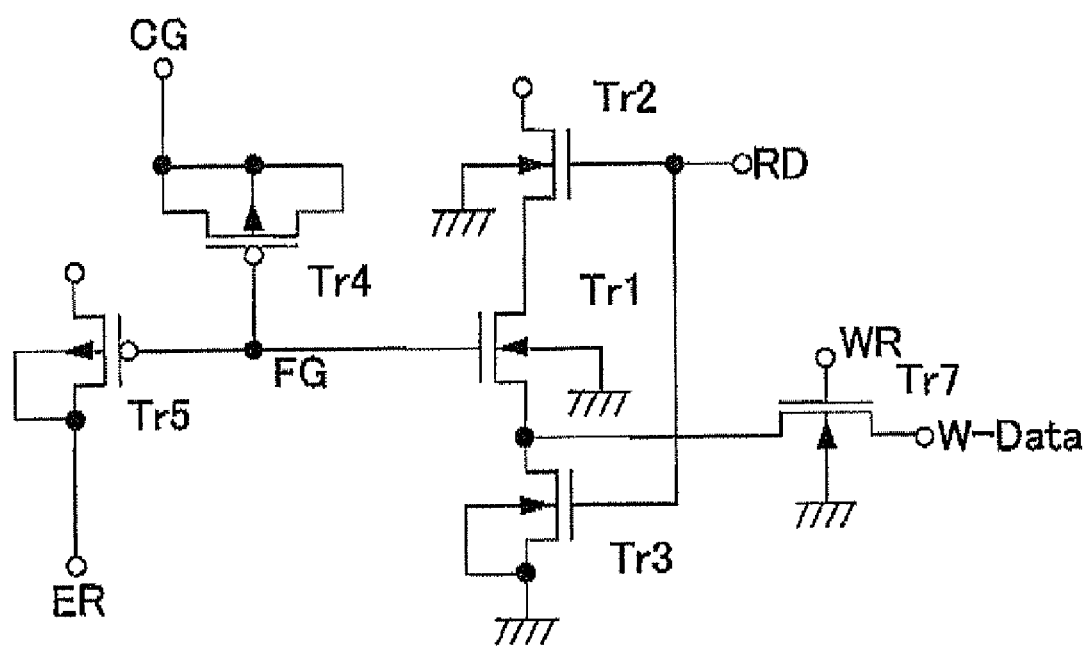
FIG. 5 is a circuit diagram showing a nonvolatile memory cell according to a second embodiment of the present invention.

FIG. 5 is a circuit diagram showing a nonvolatile memory cell according to a second embodiment of the present invention. As shown in FIG. 5, the nonvolatile memory cell according to the present embodiment has, added to the nonvolatile memory cell shown in FIG. 1, an NMOS transistor Tr7 which functions as an opening and closing gate for the write data signal W-Data.

In the nonvolatile memory cell according to the first embodiment, it is necessary to switch the entry of the write data signal W-Data to the source side of the NMOS transistor Tr1 for each of the operating modes. In this view, the present embodiment adopts a configuration in which the NMOS transistor Tr7 is added to the nonvolatile memory cell according to the first embodiment. Thus, the fundamental actions of the nonvolatile memory cell are the same as those in the first embodiment.

In the present embodiment, the write signal WR is inputted to the gate of the NMOS transistor Tr7 to shut off the entry of the data signal W-Data except in the write mode. Since CG signal is synchronized with the WR signal, it maybe used as the write signal WR. Alternatively, an inverted read signal RDZ can be utilized as the data signal W-data. In this case, except in the read mode, the NMOS transistor Tr7 is in the on state, so that the write data signal W-Data enters into the source side of the NMOS transistor Tr1. Since the memory cell is used in the wait mode most of the time, extensive care should be paid for influence which the write data signal W-Data exerts on the charge of the floating gate FG in the wait mode (the influence will be referred to hereinafter as disturb). This disturb cannot be ignored when the write data signal W-Data is in the H-state and electrons are accumulated in the floating gate FG. One of methods for avoiding this disturb is to adopt a transistor structure free from extraction of electrons from the floating gate FG. The other method is to employ a circuit configuration in which when the write data signal W-Data is in the H-state, the floating gate FG is positively charged. This embodiment will be described later concretely.

Needless to say, it is possible to use a PMOS transistor instead of the NMOS transistor Tr7 in the present embodiment.

Third Embodiment

Figure 6:
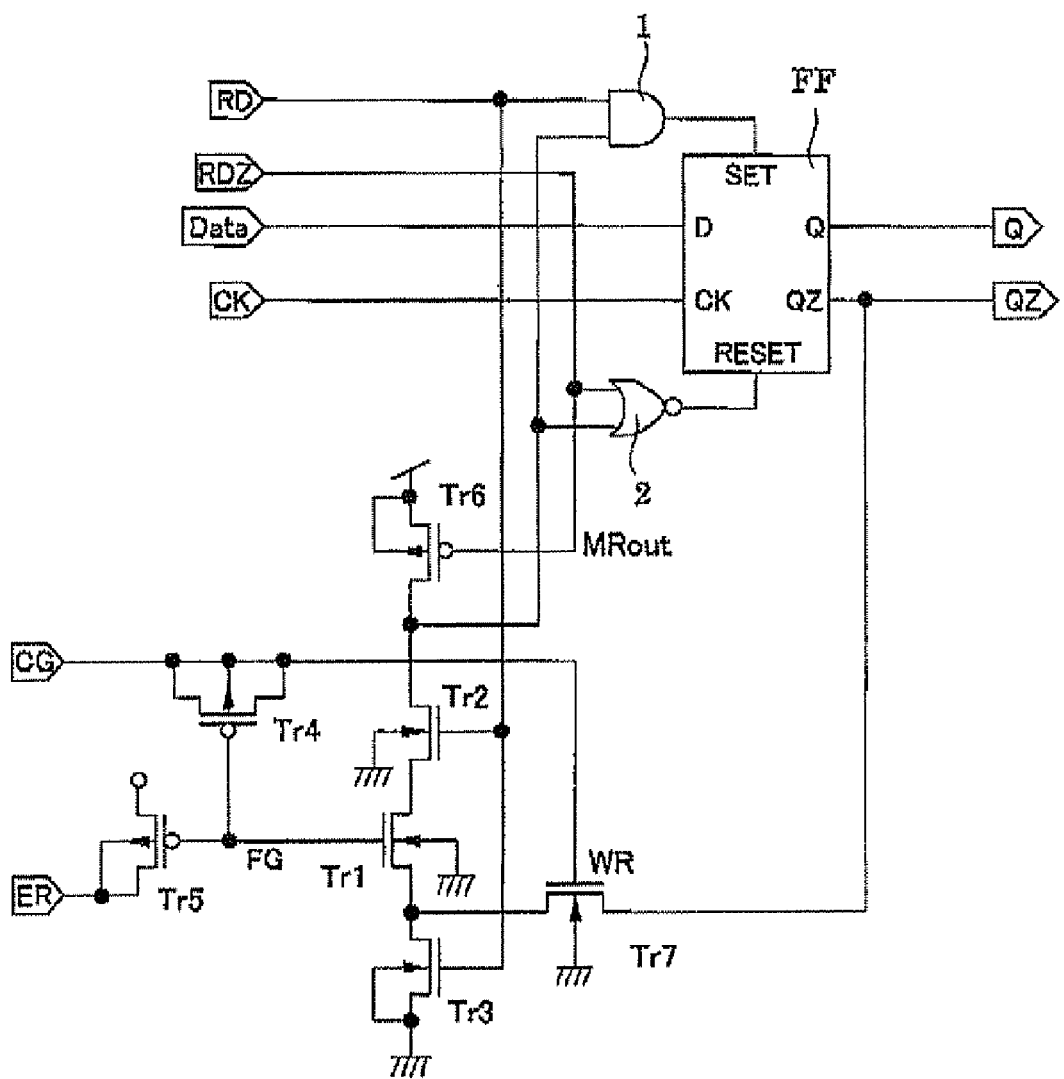
FIG. 6 is a circuit diagram showing a data latch incorporating the nonvolatile memory cell according to a third embodiment of the present invention.

FIG. 6 is a circuit diagram showing a data latch incorporating the nonvolatile memory cell according to a third embodiment of the present invention. As shown in FIG. 6, the data latch incorporating the nonvolatile memory cell according to the present embodiment is a combination of the nonvolatile memory cell explained in the first and second embodiments and a D flip-flop circuit FF which is a data latch circuit. In further detail, the D flip-flop circuit FF is set when the AND gate 1 is "true", and reset when the NOR gate 2 is "true". Here, one of the input terminals of the AND gate 1 is connected to a read signal RD, and the other input terminal is connected to a memory output MRout. One of the input terminals of the NOR gate 2 is connected to an inverted read signal RDZ, and the other input terminal is connected to the memory output MRout.

Figure 7:
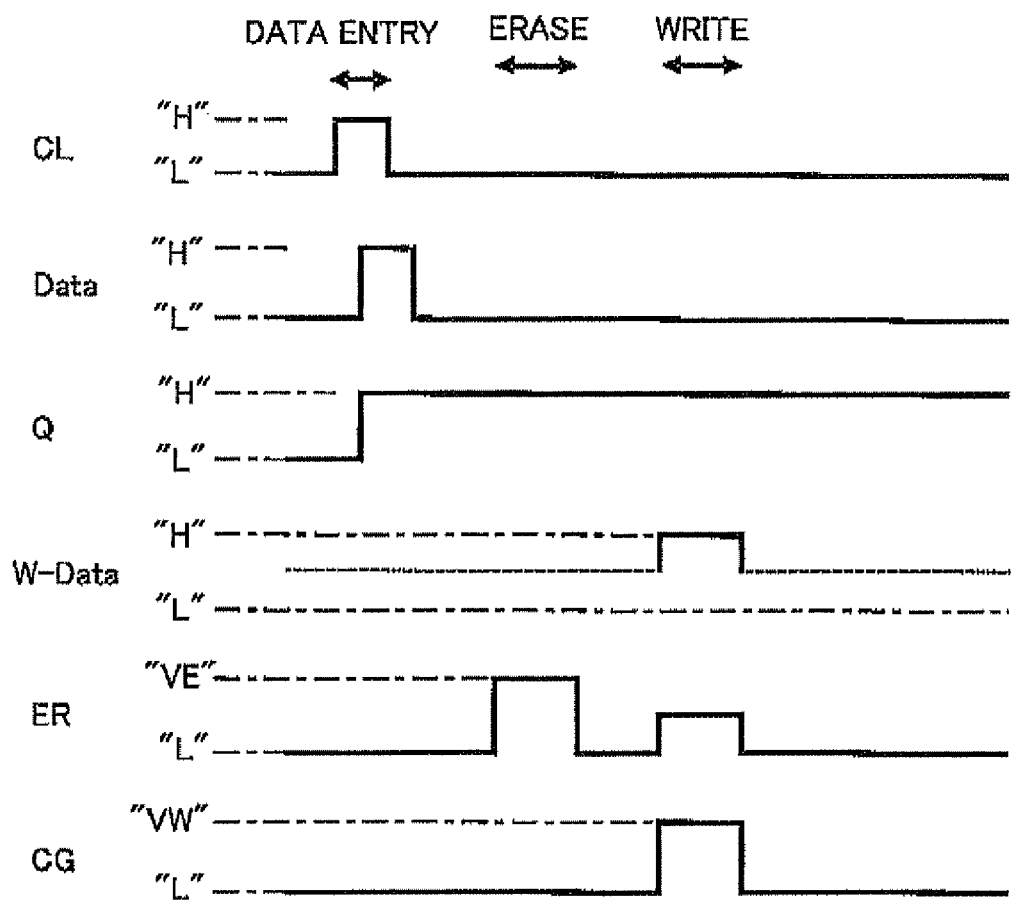
FIG. 7 is a waveform chart showing the waveforms in the respective sections in FIG. 6.

In this data latch, a data signal Data, which is a binary signal comprising the H-state and the L-state is written into the D flip-flop circuit FF synchronized with a clock signal CK as shown in a waveform chart as FIG. 7. As a result, if the data signal Data is in the H-state, an output Q of the D flip-flop circuit FF comes into the H-state at the rise of the clock signal CK, and this state is maintained after the clock signal CK goes down.

The data in the D flip-flop circuit FF are stored into the nonvolatile memory through the erase and write operating modes shown in FIG. 3 or 4. That is, in the present embodiment, an inverted output QZ of the D flip-flop circuit FF serves as the data write signal W-Data. Thus, when the data signal Data of the L-state is written, the output Q is in the L-state (inverted output QZ is in the H-state). This corresponds to the case shown in FIG. 3 in which the data write signal W-Data is in the H-state. Thus, no electrons are injected into the floating gate FG.

In the present embodiment, the control data signal CG is utilized as the write signal WR. Thus, the NMOS transistor Tr7 is in the on state only in the write mode, and write data signal W-Data can be entered into the nonvolatile memory.

When the data signal Data of the H-state, on the other hand, the output Q is in the H-state (inverted output QZ is in the L-state). This corresponds to the case shown in FIG. 4 in which the data write signal W-Data is in the L-state. Thus, electrons are injected into the floating gate FG.

In the above-mentioned manner, the data of the D flip-flop circuit FF are stored into the nonvolatile memory as the presence or absence of electrons in the floating gate FG corresponding thereto one-to-one.

By turning off the power to the data latch incorporating the nonvolatile memory cell according to the present embodiment, the predetermined contents of storage in the D flip-flop circuit FF are disappeared. However, the stored contents are retained in the nonvolatile memory. Thus, the power to the data latch incorporating the nonvolatile memory cell is turned on again, and the read signal RD goes up to "H", whereby the stored contents of the nonvolatile memory can be read into the D flip-flop circuit FF.

In further detail, when the floating gate FG is charged negatively, the NMOS transistor Tr1 is in the off state, then the memory output MRout is in the "H"-state. Thus, the AND gate 1 becomes "true" synchronized with the read signal RD. As a result, the D flip-flop circuit FF is set by the output of the AND gate 1, bringing the output Q to "H".

On the other hand, when the floating gate FG is positively charged, the NMOS transistor Tr1 is in the on state, then the memory output MRout is in the "L"-state. Thus, the NOR gate 2 becomes "true" synchronized with the read signal RD, Thus, the D flip-flop circuit FF is reset by the output of the NOR gate 2, bringing the output Q to "L".

Consequently, the data initially written into the D flip-flop circuit FF can be backed up by the nonvolatile memory. Even if the power is once turned off, the original stored contents are read out into the D flip-flop circuit FF, based on the stored data of the nonvolatile memory, when the power is subsequently turned on again. The output of the D flip-flop circuit FF is used as tuning data for the integrated circuit.

According to the data latch incorporating the nonvolatile memory cell concerned with the present embodiment, the stored contents of the nonvolatile memory can be rewritten whenever it is necessary. Concretely, new data inputted as the data signal Data is written into the D flip-flop circuit FF synchronized with of the clock signal CK. In the next stage, the stored data in the nonvolatile memory are erased by an erasing action (see FIG. 2C). Then, the data written in the D flip-flop circuit FF is transcribed onto the nonvolatile memory, and stored there, by the same action as stated above.

When the gate of the MOS transistor is formed on the gate oxide film of 7 nm to 8 nm in thickness, the actual power supply voltage VDD is preferably 6V to 7V in the erase mode and the write mode, 2V or lower in the read mode, and 2V to 4V in the wait mode (during operation of the integrated circuit). In this case, VW (9V) and VE (9V) used for write and erase modes can be easily supplied with DC-DC upconvertor built in the integrated circuit. Alternatively, in the read mode, the power supply voltage VDD of the entire integrated circuit may be kept at the voltage in the wait mode, and only the voltage of the power supply line of the data latch incorporating the nonvolatile memory cell may be lowered.

Fourth Embodiment

Figure 8:
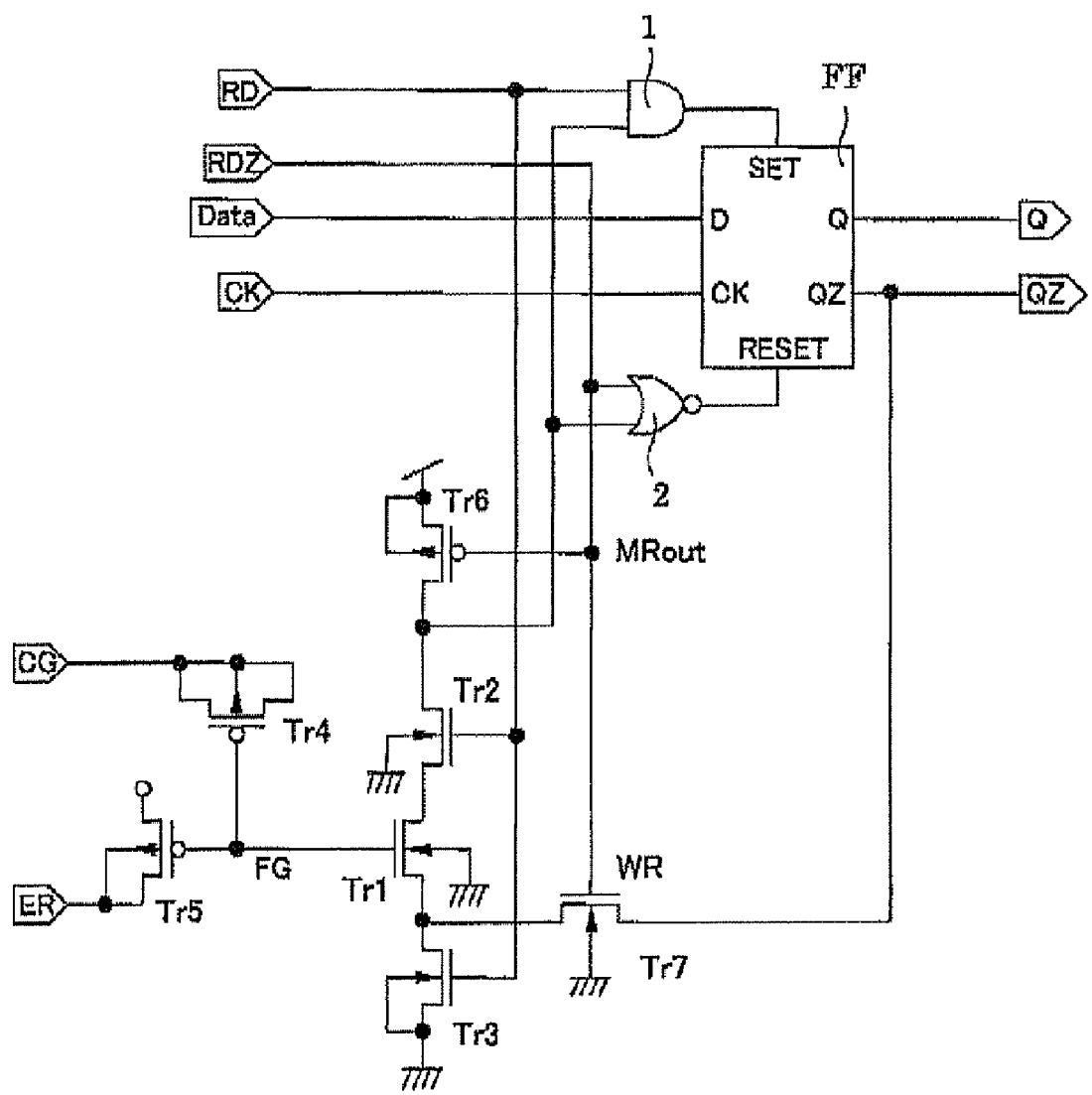
FIG. 8 is a circuit diagram showing a data latch incorporating the nonvolatile memory cell according to a fourth embodiment of the present invention.

FIG. 8 is a circuit diagram showing a data latch incorporating the nonvolatile memory cell according to a fourth embodiment of the present invention. As shown in FIG. 8, the data latch incorporating the nonvolatile memory cell according to the present embodiment uses an inverted read signal RDZ, for the write signal WR, instead of using the control data signal CG for the write signal WR in the third embodiment. In this case, the NMOS transistor Tr7 assumes the on state except in the read mode. As a result, the write data signal W-Data can be entered into the nonvolatile memory except in the read mode. The other actions and effects are exactly the same as those in the third embodiment shown in FIG. 6.

The data latch incorporating the nonvolatile memory cell according to the present embodiment presents an example of a circuit configuration which can avoid the aforementioned problem of disturb. After the power is turned on, the data latch incorporating the nonvolatile memory cell, which is used for tuning integrated circuit, initiates the read mode first, and then falls into the wait state. In the present embodiment, therefore, when the floating gate FG is positively charged, the output Q of the data latch is set in "L" by the read mode after the power is turned on. That is, the output QZ of the data latch is in "H", and the floating gate FG is not negatively charged. Thus, the problem of disturb is avoided.

Fifth Embodiment

Figure 9:
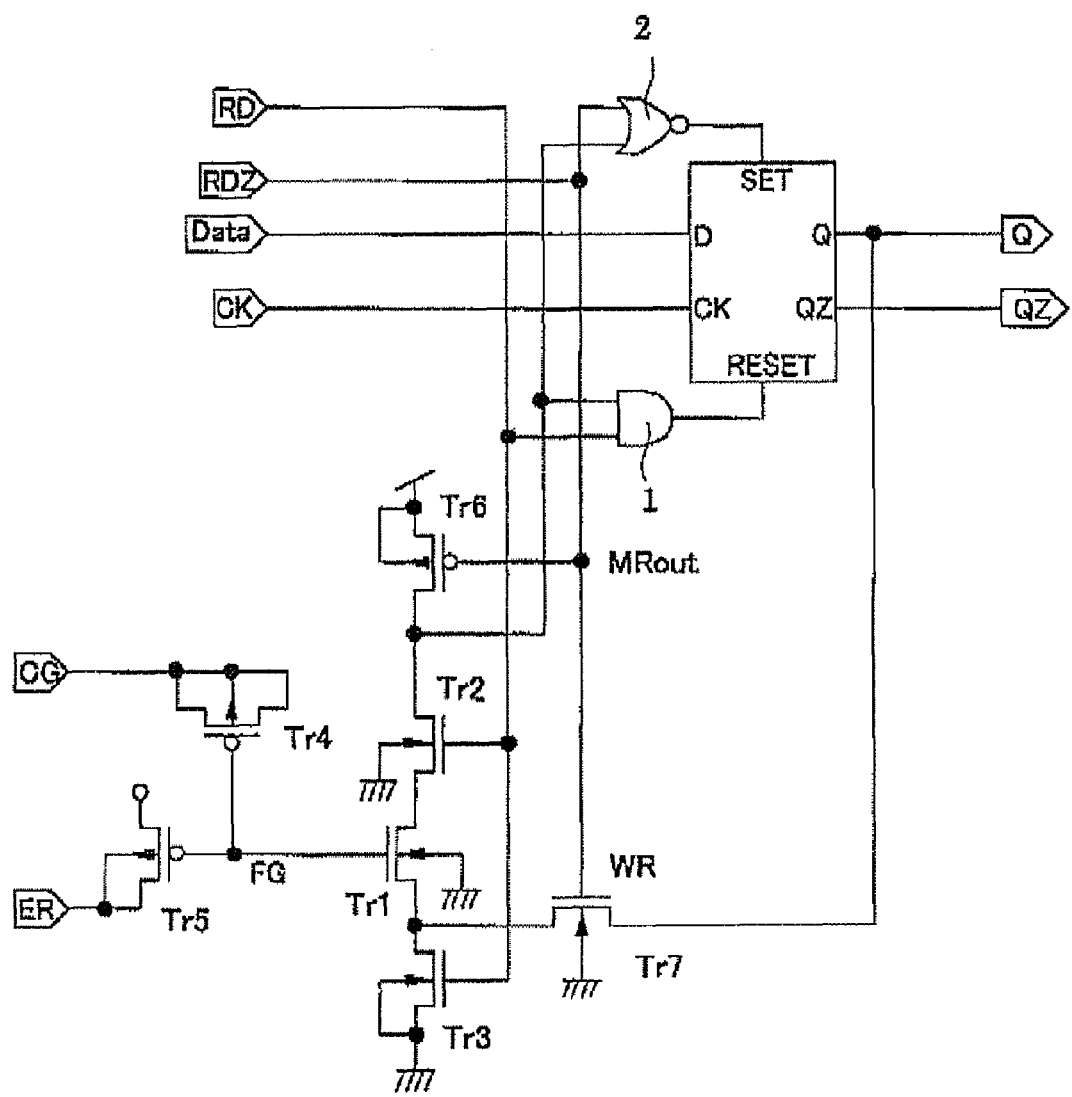
FIG. 9 is a circuit diagram showing a data latch incorporating the nonvolatile memory cell according to a fifth embodiment of the present invention.
Figure 10:
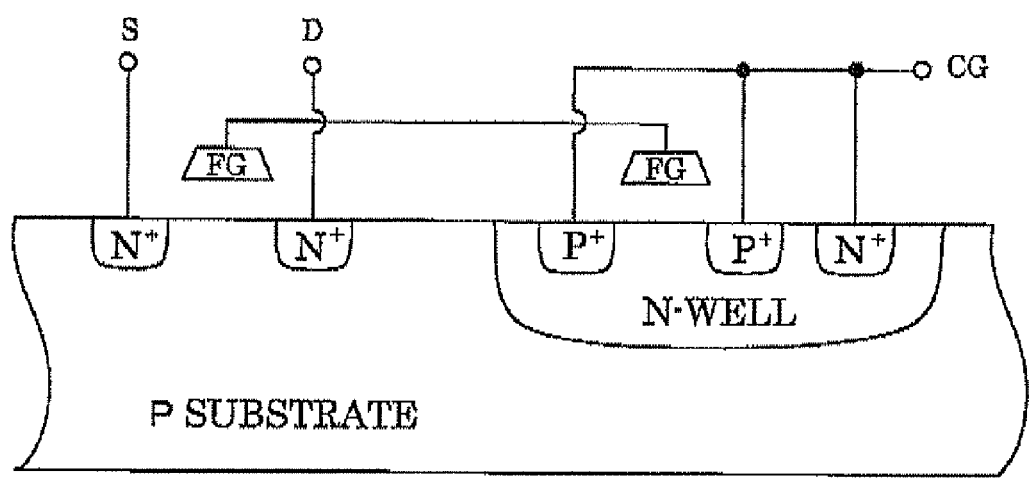
FIG. 10 is a structural drawing showing an example of nonvolatile memory cell according to prior art.

FIG. 9 is a circuit diagram showing a data latch incorporating the nonvolatile memory cell according to a fifth embodiment of the present invention. As shown in FIG. 9, the data latch incorporating the nonvolatile memory cell according to the present embodiment uses the output Q of the D flip-flop circuit FF as the write data signal W-data.

The data signal Data in the present embodiment is used an inverted data in the third embodiment. In the read mode, the data latch is reset when NMOS transistor Tr1 is in the on state, and the data latch is set when it is in the off state. The other actions and effects are exactly the same as those in the third embodiment shown in FIG. 6.

Other Embodiments

In the foregoing embodiments, the PMOS transistor Tr5 is provided to be capable of erasing the stored contents, namely, rewriting the stored data, but the PMOS transistor Tr5 for erasure is not necessarily required. If the PMOS transistor Tr5 for erasure is not provided, the stored data cannot be rewritten, but the memory cell can effectively function as so-called OTP (one time PROM).

The data write signal W-Data maybe inputted to the drain side, as well as the source side, of the NMOS transistor Tr1.

Furthermore, the drain of the PMOS transistor Tr4 and the drain of the PMOS transistor Tr5 are not necessarily formed, because these can be floated in terms of potential. Needless to say, a configuration that utilizes the drain region instead of the source region may be adopted here.

INDUSTRIAL APPLICABILITY

The present invention can be utilized effectively in industries where electronic components are manufactured and sold.

REFERENCE SIGNS LIST

Tr1 to Tr3, Tr7 NMOS transistor
Tr4 to Tr6 PMOS transistor
CG Control gate signal
FG Floating gate
ER Erase signal
RD Read signal
W-Data Write data signal
MRout Memory output
FF D flip-flop circuit

CITATION LIST

[Patent Literature 1] U.S. Pat. No. 5,465,231

The invention claimed is:

1. A nonvolatile memory cell, comprising:
a first NMOS transistor having a floating gate;
a second NMOS transistor and a third NMOS transistor connected to a drain side and a source side of the first NMOS transistor respectively;
a first PMOS transistor having the floating gate as a gate; and
a second PMOS transistor having the floating gate as a gate, and
wherein a read signal is inputted to gates of the second and third NMOS transistors,
a control gate signal is inputted to a source and an n-well of the first PMOS transistor,
a write data signal is inputted to either a drain or a source of the first NMOS transistor,
an erase signal is inputted to a source and an n-well of the second PMOS transistor, and
electrons in the floating gate are erased by a tunnel current flowing through a gate insulating film of the second PMOS transistor while applying positive voltage pulses as the erase signal, with the control gate signal being set at a reference voltage.

2. The nonvolatile memory cell according to claim 1, wherein the write data signal is inputted via an opening and closing gate.

3. The nonvolatile memory cell according to claim 2, wherein
the opening and closing gate is composed of an NMOS transistor or a PMOS transistor.

4. The nonvolatile memory cell according to claim 2, wherein
the opening and closing gate is brought into conduction when electrons are written into the floating gate.

5. The nonvolatile memory cell according to claim 2, wherein
the opening and closing gate is shut off only during reading.

6. The nonvolatile memory cell according to claim 1, wherein
writing of electrons into the floating gate is performed by a tunnel current flowing through a gate insulating film of the first NMOS transistor while turning off the second and third NMOS transistors by use of the read signal, applying positive voltage pulses as the control gate signal and an erase signal, and applying the write data signal which controls the tunneling current.

7. The nonvolatile memory cell according to claim 1, wherein
reading from the nonvolatile memory cell is performed by inputting a positive voltage as the read signal, and opening the gates of the second and third NMOS transistors.

8. A data latch incorporating a nonvolatile memory cell, comprising the nonvolatile memory cell according to claim 1, and a data latch circuit, and wherein a drain of the second NMOS transistor is connected to a load element to become a set signal for setting a state of the data latch circuit, and a Q output of the data latch circuit or an inverted output of the Q output becomes the write data signal.

9. A nonvolatile memory cell, comprising:
a first NMOS transistor having a floating gate;
a second NMOS transistor and a third NMOS transistor connected to a drain side and a source side of the first NMOS transistor respectively; and
a first PMOS transistor having the floating gate as a gate, and
wherein a read signal is inputted to gates of the second and third NMOS transistors,
a control gate signal is inputted to a source and an n-well of the first PMOS transistor,
a write data signal is inputted to either a drain or a source of the first NMOS transistor, and
writing of electrons into the floating gate is performed by a tunnel current flowing through a gate insulating film of the first NMOS transistor while turning off the second and third NMOS transistors by use of the read signal, applying positive voltage pulses as the control gate signal and an erase signal, and applying the write data signal which controls the tunnel current.

10. A data latch incorporating a nonvolatile memory cell, the nonvolatile memory cell comprising:
a first NMOS transistor having a floating gate;
a second NMOS transistor and a third NMOS transistor connected to a drain side and a source side of the first NMOS transistor respectively; and
a first PMOS transistor having the floating gate as a gate, and
wherein a read signal is inputted to gates of the second and third NMOS transistors,
a control gate signal is inputted to a source and an n-well of the first PMOS transistor, and
a write data signal is inputted to either a drain or a source of the first NMOS transistor, and
a data latch circuit, and
wherein a drain of the second NMOS transistor is connected to a load element to become a set signal for setting a state of the data latch circuit, and a Q output of the data latch circuit or an inverted output of the Q output becomes the write data signal.

* * * * *